(12) United States Patent
Hokazono

(10) Patent No.: US 7,888,747 B2
(45) Date of Patent: Feb. 15, 2011

(54) SEMICONDUCTOR DEVICE AND METHOD OF FABRICATING THE SAME

(75) Inventor: Akira Hokazono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/421,203

(22) Filed: Apr. 9, 2009

(65) Prior Publication Data
US 2009/0283842 A1 Nov. 19, 2009

(30) Foreign Application Priority Data
May 19, 2008 (JP) ............................. 2008-131158

(51) Int. Cl.
*H01L 27/088* (2006.01)
(52) U.S. Cl. ............... 257/392; 257/402; 257/E27.061; 438/197; 438/275
(58) Field of Classification Search ............... 257/392, 257/402, E21.631, E21.633, E27.061; 438/197, 438/275, 938
See application file for complete search history.

(56) References Cited

U.S. PATENT DOCUMENTS

| 6,271,551 B1 * | 8/2001 | Schmitz et al. ............. 257/288 |
| 2003/0052348 A1 * | 3/2003 | Takagi et al. ................ 257/288 |
| 2005/0151202 A1 | 7/2005 | Wieczorek et al. | |

OTHER PUBLICATIONS

T. Ernst, et al., "A New Si:C Epitaxial Channel nMOSFET Architecture with Improved Drivability and Short-Channel Characteristics", Symposium on VLSI Technology Digest of Technical Papers, 2003, pp. 51-52.
Hong-Jyh Li, et al., "The Pile-Ups of Aluminum and Boron in the Sige (c) ", Materials Research. Society. Symp. Proc. vol. 737, 2003, pp. 643-649.
F. Ducroquet, et al., "Double SiGe:C Diffusion Barrier Channel 40nm CMOS with Improved Short-Channel Performances", IEPM Technical Digest, 2004, 4 pages.

* cited by examiner

*Primary Examiner*—Victor A Mandala
*Assistant Examiner*—Scott Stowe
(74) *Attorney, Agent, or Firm*—Oblon, Spivak, McClelland, Maier & Neustadt, L.L.P.

(57) ABSTRACT

A semiconductor device includes a semiconductor substrate; a first impurity diffusion suppression layer and a thicker second impurity diffusion suppression layer formed on the semiconductor substrate in first and second isolated transistor regions; first and second crystal layers formed on the first and second impurity diffusion suppression layers; first and second gate electrodes formed on the first and second crystal layers; first and second p-type channel regions formed in the semiconductor substrate, the first impurity diffusion suppression layer and respective of the first and second crystal layers below the first and second gate electrodes; and first and second source/drain regions formed on both sides of the first and second channel region; wherein the first and second p-type channels have lower impurity concentrations in respective of the first and second crystal layers than in the semiconductor substrate.

20 Claims, 10 Drawing Sheets

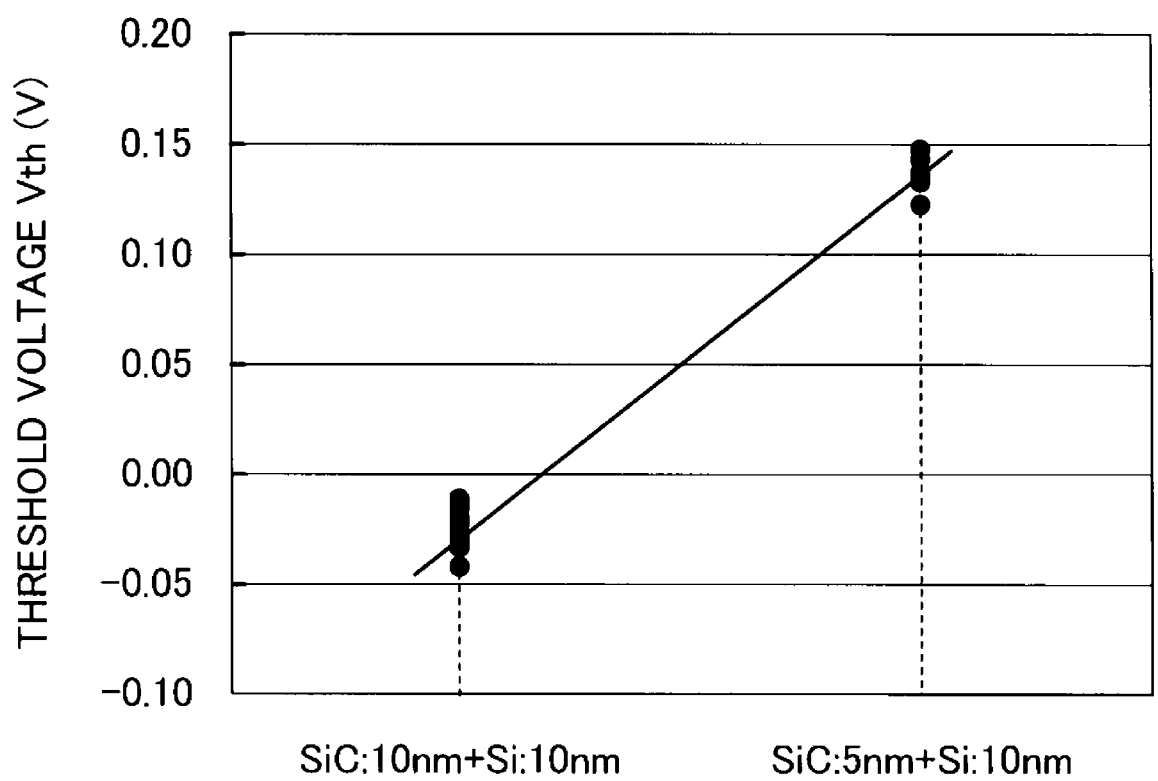

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2008-131158, filed on May 19, 2008, the entire contents of which are incorporated herein by reference.

BACKGROUND

A conventional transistor structure is known in which a layer made of Si:C or SiGe:C, etc., is formed on a region into which B (boron) as a channel impurity is diffused, and a Si layer into which an impurity is not implanted intentionally is formed thereon. This structure, for example, is disclosed in documents of Hong-Jyh Li et al., "Mat. Res. Soc. Symp. Proc.", vol. 737, p. 643, 2003. and F. Ducroquet et al., "2004 IEDM Technical Digest.", p. 437.

According to the transistor described in documents, since diffusion of B is suppressed in a Si:C layer, diffusion of B into the Si layer is suppressed in a channel region, and it is thereby possible to form a channel region having a steep impurity concentration distribution.

BRIEF SUMMARY

A semiconductor device according to one embodiment includes: a semiconductor substrate comprising first and second transistor regions that are isolated by an element isolation region; a first impurity diffusion suppression layer formed on the semiconductor substrate in the first transistor region; a second impurity diffusion suppression layer formed on the semiconductor substrate in the second transistor region, and having a thickness larger than that of the first impurity diffusion suppression layer; a first crystal layer formed on the first impurity diffusion suppression layer; a second crystal layer formed on the second impurity diffusion suppression layer; a first gate electrode formed on the first crystal layer via a first gate insulating film; a second gate electrode formed on the second crystal layer via a second gate insulating film; a first channel region formed in a region in the semiconductor substrate, the first impurity diffusion suppression layer and the first crystal layer below the first gate electrode in the first transistor region, and containing a first p-type impurity; a second channel region formed in a region in the semiconductor substrate, the second impurity diffusion suppression layer and the second crystal layer below the second gate electrode in the second transistor region, and containing a second p-type impurity; first source/drain regions formed on both sides of the first channel region; and second source/drain regions formed on both sides of the second channel region; wherein a concentration of the first p-type impurity in a region of the first channel region in the first crystal layer is lower than that in a region of the first channel region in the semiconductor substrate; and a concentration of the second p-type impurity in a region of the second channel region in the second crystal layer is lower than that in a region of the second channel region in the semiconductor substrate.

A semiconductor device according to another embodiment includes: a semiconductor substrate comprising first and second transistor regions that are isolated by an element isolation region; a first gate electrode formed on the semiconductor substrate via a first gate insulating film in the first transistor region; an impurity diffusion suppression layer formed on the semiconductor substrate in the second transistor region; a crystal layer formed on the impurity diffusion suppression layer; a second gate electrode formed on the crystal layer via a second gate insulating film; a first channel region formed in a region in the semiconductor substrate below the first gate electrode in the first transistor region, and containing a conductivity type impurity; a second channel region formed in a region in the semiconductor substrate, the impurity diffusion suppression layer and the crystal layer below the second gate electrode in the second transistor region, and containing a p-type impurity; first source/drain regions formed on both sides of the first channel region; and second source/drain regions formed on both sides of the second channel region; wherein a concentration of the p-type impurity in a region of the second channel region in the crystal layer is lower than that in a region of the second channel region in the semiconductor substrate; and the concentration of the p-type impurity in the region of the second channel region in the semiconductor substrate is higher than a concentration of the conductivity type impurity in the first channel region.

A method of fabricating a semiconductor device according to another embodiment includes: forming first and second channel regions by implanting a p-type impurity into the vicinity of a surface of the semiconductor substrate in each of first and second transistor regions; forming a first impurity diffusion suppression layer on the first channel region and then a first crystal layer on the impurity diffusion suppression layer as well as forming a second impurity diffusion suppression layer on the second channel region and then a second crystal layer on the second impurity diffusion suppression layer, the first and second impurity diffusion suppression layers having a function of suppressing diffusion of the p-type impurity, the second impurity diffusion suppression layer being thicker than the first impurity diffusion suppression layer; and each forming gate electrodes on the first and second crystal layers via gate insulating films.

BRIEF DESCRIPTION OF THE DRAWING

FIG. 3 is a graph showing a relation between an impurity diffusion suppression layer and threshold voltage evaluated by experiments;

DETAILED DESCRIPTION

First Embodiment

Figure 1:
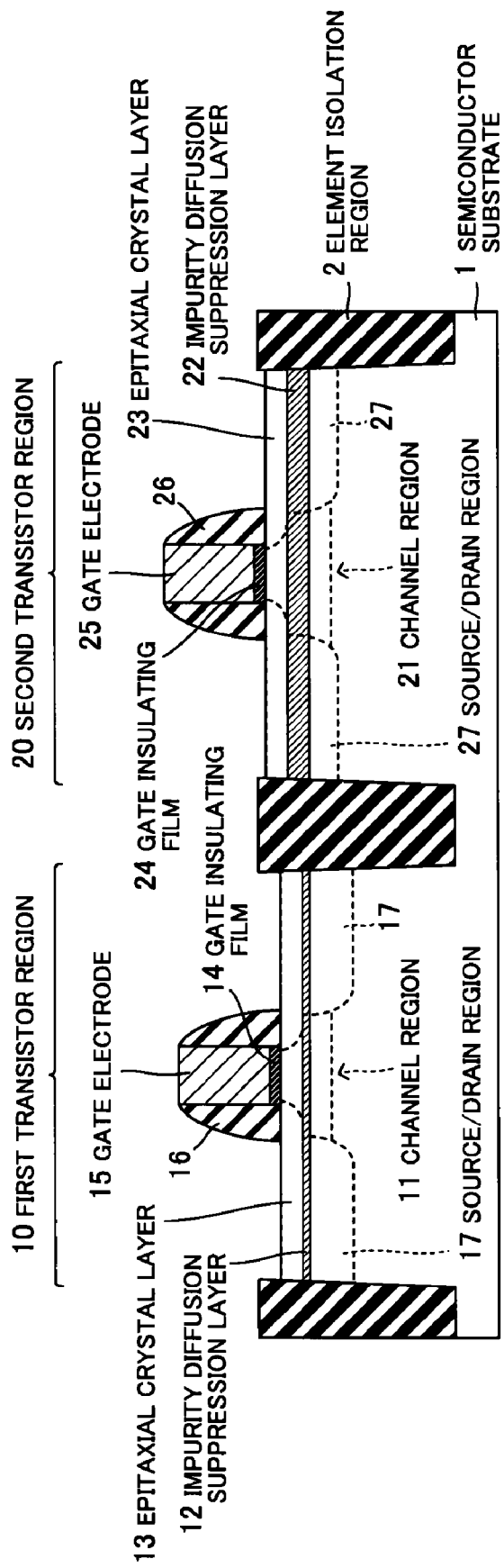
FIG. 1 is a cross sectional view showing a semiconductor device according to a first embodiment.

FIG. 1 is a cross sectional view showing a semiconductor device according to a first embodiment.

A semiconductor device according to the present embodiment has first and second n-type transistor regions 10 and 20 on a semiconductor substrate 1, and the first and second transistor regions 10 and 20 are electrically isolated by an element isolation region 2.

The first transistor region 10 includes an impurity diffusion suppression layer 12 formed on the semiconductor substrate 1, an epitaxial crystal layer 13 formed on the impurity diffusion suppression layer 12, a gate electrode 15 formed on the epitaxial crystal layer 13 via a gate insulating film 14, gate sidewalls 16 formed on side faces of the gate electrode 15, a channel region 11 formed in a region in the semiconductor substrate 1, the impurity diffusion suppression layer 12 and the epitaxial crystal layer 13 below the gate electrode 15, and source/drain regions 17 formed on both sides of the channel region 11.

The second transistor region 20 includes an impurity diffusion suppression layer 22 formed on the semiconductor substrate 1, an epitaxial crystal layer 23 formed on the impurity diffusion suppression layer 22, a gate electrode 25 formed on the epitaxial crystal layer 23 via a gate insulating film 24, gate sidewalls 26 formed on side faces of the gate electrode 25, a channel region 21 formed in a region in the semiconductor substrate 1, the impurity diffusion suppression layer 22 and the epitaxial crystal layer 23 below the gate electrode 25, and source/drain regions 27 formed on both sides of the channel region 21.

A Si-based substrate such as a Si substrate, etc., is used for the semiconductor substrate 1.

The element isolation region 2 is made of an insulating film such as $SiO_2$, etc., and has a STI (Shallow Trench Isolation) structure with a depth of, e.g., 200-300 nm.

The channel regions 11 and 21 each contain a p-type impurity such as B or In, etc., which is implanted in order to adjust threshold voltage, etc.

The impurity diffusion suppression layers 12 and 22 each have a property that the p-type impurities contained in the channel regions 11 and 21 are less likely to diffuse therein. For example, when the p-type impurities contained in the channel regions 11 and 21 are B or In, a Si:C crystal, a SiGe crystal or a SiGe:C crystal, etc., having a property that B and In are less likely to diffuse therein is used for a material of the impurity diffusion suppression layers 12 and 22. In addition, the impurity diffusion suppression layer 22 is thicker than the impurity diffusion suppression layer 12. Furthermore, the impurity diffusion suppression layer 12 is, e.g., 2-14 nm in thickness and the impurity diffusion suppression layer 22 is, e.g., 3-15 nm in thickness.

Note that, when the impurity diffusion suppression layers 12 and 22 are made of the Si:C crystal, a C concentration is preferably 0.05-3 At % (not less than 0.05 atomic percentage and not more than 3 atomic percentage). When the C concentration in the Si:C crystal is less than 0.05 At %, a function of suppressing the diffusion of B or In may be insufficient, and when exceeding 3 At %, operating characteristics of the transistor may deteriorate. This is because, since the interstitial distance in the Si:C crystal decreases with increasing the C concentration, a stress generated in the epitaxial crystal layers 13 and 23 due to a difference between a lattice constant of the epitaxial crystal layers 13 and 23 as upper layers and that of the impurity diffusion suppression layers 12 and 22 may be increased to the level that adversely affects the operating characteristics of the transistor.

The epitaxial crystal layers 13 and 23 are made of a Si-based crystal such as a Si crystal, etc., formed by an epitaxial crystal growth method using each of the impurity diffusion suppression layers 12 and 22 as a base. In addition, the epitaxial crystal layers 13 and 23 are, e.g., 5-20 nm in thickness.

The gate insulating films 14 and 24 are made of, e.g., an insulating material such as $SiO_2$, SiN or SiON, etc. In addition, the gate insulating films 14 and 24 are, e.g., 0.5-6 nm in thickness.

The gate electrodes 15 and 25 are made of, e.g., Si-based polycrystalline such as polycrystalline silicon, etc., containing an n-type impurity. As or P, etc., is used as the n-type impurity. Alternatively, silicide layers containing a metal such as Ni, Co, Er, Pt or Pd, etc., may be formed on upper surfaces of the gate electrodes 15 and 25. In addition, the gate electrodes 15 and 25 are, e.g., 50-200 nm in thickness.

The gate sidewalls 16 and 26 are made of, e.g., an insulating material such as SiN, etc. In addition, the gate sidewalls 16 and 26 may have a structure of two layers made of multiple types of insulating material comprising SiN, $SiO_2$, TEOS (Tetraethoxysilane), etc., furthermore, may have a structure of three or more layers.

The source/drain regions 17 and 27 are regions containing an n-type impurity. As or P, etc., is used as the n-type impurity. The source/drain regions 17 are formed in, e.g., the semiconductor substrate 1, the impurity diffusion suppression layer 12 and the epitaxial crystal layer 13 in the first transistor region 10. Meanwhile, the source/drain regions 27 are formed in, e.g., the semiconductor substrate 1, the impurity diffusion suppression layer 22 and the epitaxial crystal layer 23 in the second transistor region 20. In addition, silicide layers containing a metal such as Ni, Co, Er, Pt or Pd, etc., may be formed on the upper surfaces of the epitaxial crystal layers 13 and 23 having the source/drain regions 17 and 27 formed therein.

Figure 2A:
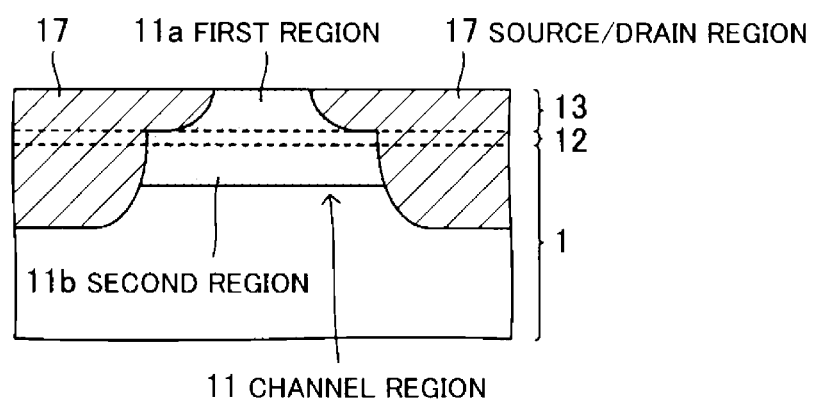
FIGS. 2A and 2B are partial cross sectional views showing a periphery of a channel region in each of first and second transistor regions.
Figure 2B:
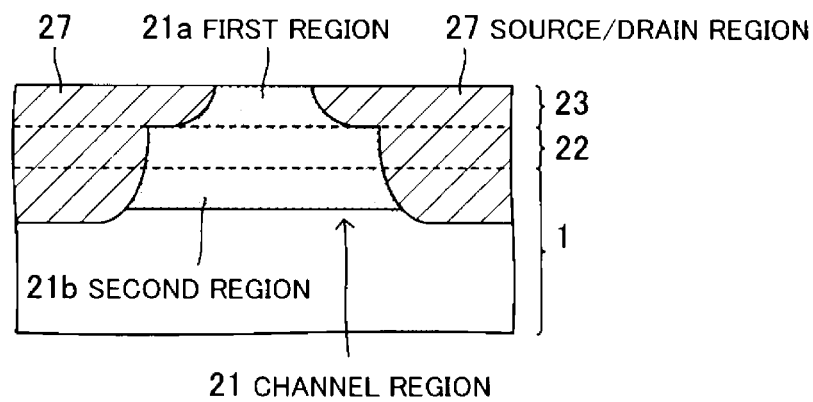

FIGS. 2A and 2B are partial cross sectional views showing a periphery of a channel region in each of first and second transistor regions. Note that, illustrations of the gate insulating films 14 and 24, the gate electrodes 15 and 25 and the gate sidewalls 16 and 26 are omitted in FIGS. 2A and 2B.

The channel region 11 includes a first region 11a that is a region on the impurity diffusion suppression layer 12 and a second region 11b that is a region under the impurity diffusion suppression layer 12. Meanwhile, the channel region 21 includes a first region 21a that is a region on the impurity diffusion suppression layer 22 and a second region 21b that is a region under the impurity diffusion suppression layer 22.

Here, the second regions 11b and 21b are regions into which p-type impurities used for adjusting threshold voltage, etc., are directly implanted in the fabrication process thereof. On the other hand, the first regions 11a and 21a are regions into which the p-type impurities are not directly implanted in the fabrication process, thus, the p-type impurities contained in the first regions 11a and 21a are the impurities that have diffusively migrated from the second regions 11b and 21b.

In the meantime, the impurity diffusion suppression layers 12 and 22 each have a property that the p-type impurities contained in the channel regions 11 and 21 are less likely to diffuse therein. Therefore, the diffusion migration of the p-type impurity from the second regions 11b and 21b into the first regions 11a and 21a is suppressed by the impurity diffusion suppression layers 12 and 22. Thus, a concentration of the p-type impurity contained in the first region 11a is lower than that in the second region 11b, and a concentration of the p-type impurity contained in the first region 21a is lower than that in the second region 21b. The impurity concentration distributions in the channel regions 11 and 21 can be steepened by sufficiently decreasing the impurity concentration of the first regions 11a and 21a than that of the second regions 11b and 21b.

Furthermore, since the impurity diffusion suppression layer 22 is thicker than the impurity diffusion suppression layer 12, it is possible to suppress the diffusion of the p-type impurity more effectively. Therefore, even when the p-type impurities are implanted into the second regions 11b and 21b at the same concentration, it is possible to decrease the concentration of the p-type impurity contained in the first region 21a than that in the first regions 11a. Since the first regions 11a and 21a are main current pathways when operating the transistor, the threshold voltage of the transistor can be set to be low by decreasing the concentration of the p-type impurity in these regions. Therefore, it is possible to set the threshold voltage of the transistor in the second transistor region 20 lower than that of the transistor in the first transistor region 10.

FIG. 3 is a graph showing a relation between an impurity diffusion suppression layer and threshold voltage evaluated by experiments. In the present experiment, a Si:C crystal is used as an impurity diffusion suppression layer, Si is used as an epitaxial crystal layer and B is used as a p-type impurity contained in a channel region. A set of measurement points on left side in FIG. 3 is a measurement result when thicknesses of the Si:C crystal layer and the Si crystal are each 10 nm, and a set of measurement points on right side is a measurement result when thicknesses of the Si:C crystal and the Si crystal are 5 nm and 10 nm, respectively.

FIG. 3 shows a result that the threshold voltage is lowered with increasing the thickness of the Si:C crystal as the impurity diffusion suppression layer. Although magnitude of each threshold voltage varies depending on size or material of each portion of the transistor, the magnitude correlation of the threshold voltage with respect to the thickness of the Si:C crystal does not change.

In addition, it is considered that a phenomenon that the amount of fixed charge in the periphery of the channel region increases with thickening the impurity diffusion suppression layer also contributes to lower the threshold voltage of the transistor in the second transistor region 20 than that in the first transistor region 10. Note that, it is confirmed that advantage of current drive by the steepened impurity concentration distribution in the channel regions 11 and 21 is larger than loss of current drive by generation of the fixed charge.

Although an example of a method of fabricating a semiconductor device according to the present embodiment will be described hereinafter, the method is not limited thereto, practically.

FIGS. 4A to 4E are cross sectional views showing processes for fabricating the semiconductor device according to the first embodiment.

Figure 4A:
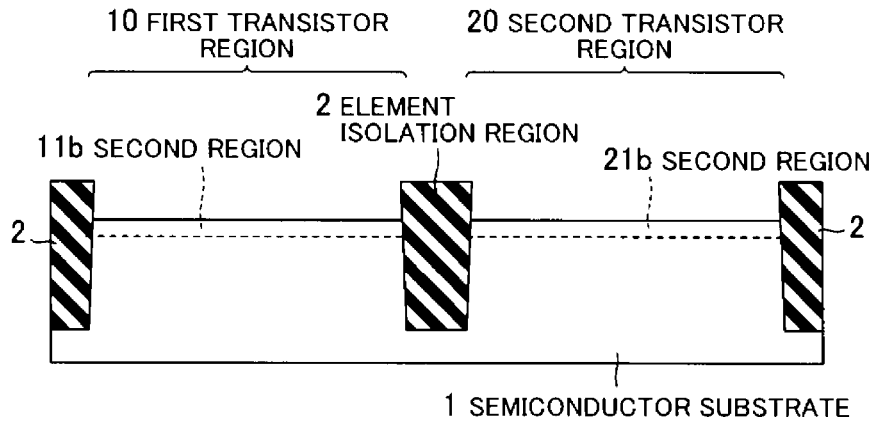
FIGS. 4A to 4E are cross sectional views showing processes for fabricating the semiconductor device according to the first embodiment.

Firstly, as shown in FIG. 4A, the element isolation region 2 is formed in the semiconductor substrate 1 by shallow trench isolation for isolating the first transistor region 10 from the second transistor region 20. Following this, after forming a 10 nm-thick natural oxide film (not shown), wells (not shown) and the second regions 11b and 21b are formed by implanting a p-type impurity into a surface of the semiconductor substrate 1 by ion implantation procedure. After that, heat treatment such as RTA (Rapid Thermal Annealing), etc., is carried out for activating the p-type impurity in the wells and the second regions 11b and 21b. The concentrations of the p-type impurity in the second regions 11b and 21b are substantially same at this point.

Here, for example, when a p-type well is formed using B, ion implantation is carried out under conditions of an implantation energy of 260 keV and a dosage of $2.0 \times 10^{13}$ cm$^{-2}$. Meanwhile, when the second regions 11b and 21b (p-type channel) are formed using B, the ion implantation is carried out under conditions of an implantation energy of 10 keV and a dosage of $2.0 \times 10^{12}$-$1.5 \times 10^{13}$ cm$^{-2}$.

Note that, in the present embodiment, it is preferable that depletion layers are formed only in the first regions 11a and 21a of the channel regions 11 and 21 when operating the transistor. Therefore, in order to suppress extension of the depletion layers to the second region 11b and 21b, it is important to adjust a channel concentration (the impurity concentration in the second region 11b and 21b).

Figure 4B:
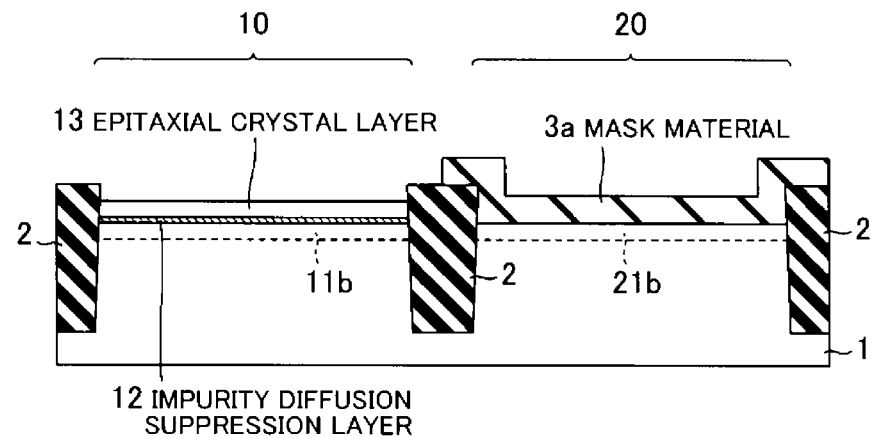

Next, as shown in FIG. 4B, a mask material 3a is formed on the second region 21b in the second transistor region 20, and the impurity diffusion suppression layer 12 and the epitaxial crystal layer 13 are formed on the second region 11b in the first transistor region 10 in which the mask material 3a is not formed. Note that, the natural oxide film (not shown) on a region of the semiconductor substrate 1 having the second region 11b formed therein is removed using dilute hydrofluoric acid, etc., before forming the impurity diffusion suppression layer 12.

Here, an insulating film made of SiO$_2$ or SiN, etc., is formed on the whole surface of the semiconductor substrate 1 and a portion of the insulating film on the first transistor region 10 is removed using dilute hydrofluoric acid or hot phosphoric acid heated to about 170° C., which results in that the mask material 3a is formed.

Then, the impurity diffusion suppression layer 12 is formed by the epitaxial crystal growth method using a portion of the semiconductor substrate 1 having the second region 11b formed therein as a base. And then, the epitaxial crystal layer 13 is formed by the epitaxial crystal growth method using the impurity diffusion suppression layer 12 as a base. Note that, these epitaxial crystal growth methods are carried out, e.g., under a high temperature of 700° C. or more in a hydrogen atmosphere.

When, for example, the Si:C crystal is epitaxially grown as the impurity diffusion suppression layer 12, for example, a gas being a raw material of Si such as monosilane (SiH$_4$), dichlorosilane (SiH$_2$Cl$_2$) or trichlorosilane (SiHCl$_3$), etc., a gas being a raw material of C such as acetylene (C$_2$H$_2$) or monomethylsilane (SiH$_3$CH$_3$), etc., and a hydrogen chloride (HCl) gas are used as a reaction gas. Alternatively, the Si:C crystal may be formed by implanting C by the ion implantation procedure, etc., after forming the Si crystal.

In addition, when the Si crystal is epitaxially grown as the epitaxial crystal layer 13, for example, the above-mentioned gas being a raw material of Si and the hydrogen chloride (HCl) gas are used as a reaction gas.

Figure 4C:
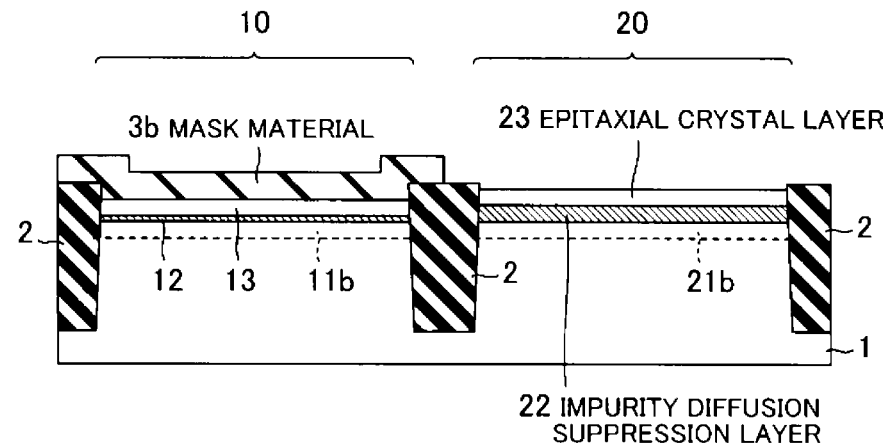

Next, as shown in FIG. 4C, a mask material 3b is formed on the epitaxial crystal layer 13 in the first transistor region 10 after removing the mask material 3a, and the impurity diffusion suppression layer 22 and the epitaxial crystal layer 23 are formed on the second region 21b in the second transistor region 20 in which the mask material 3b is not formed. Note that, the natural oxide film (not shown) on a region of the semiconductor substrate 1 having the second region 21b formed thereon is removed using dilute hydrofluoric acid, etc., before forming the impurity diffusion suppression layer 22.

Here, an insulating film made of SiO$_2$ or SiN, etc., is formed on the whole surface of the semiconductor substrate 1 and a portion of the insulating film on the second transistor region 20 is removed using dilute hydrofluoric acid or hot phosphoric acid heated to about 170° C., which results in that the mask material 3b is formed.

Then, the impurity diffusion suppression layer 22 is formed to be thicker than the impurity diffusion suppression layer 12 by the epitaxial crystal growth method using a portion of the semiconductor substrate 1 having the second region 21b formed therein as a base. And then, the epitaxial crystal layer 23 is formed by the epitaxial crystal growth method using the impurity diffusion suppression layer 22 as a base. Note that, conditions of these epitaxial crystal growth methods and the reaction gas to be used are the same as in the case of forming the impurity diffusion suppression layer 12 and the epitaxial crystal layer 13.

Figure 4D:
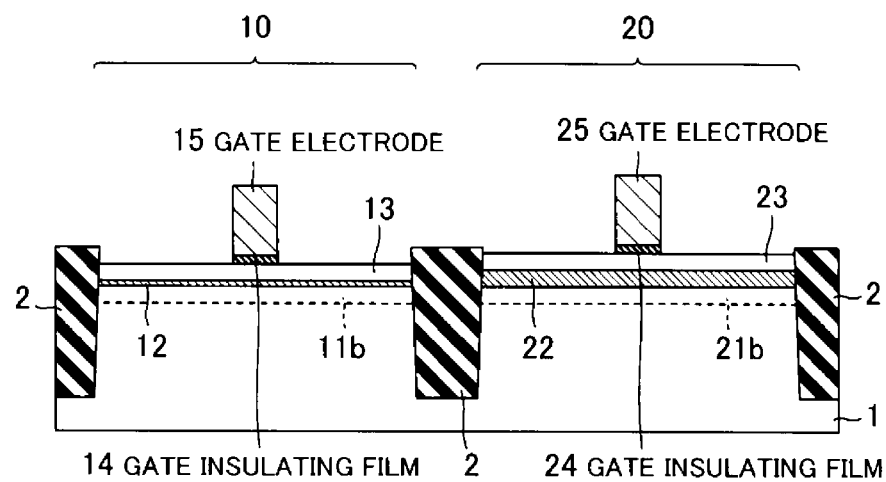

Next, as shown in FIG. 4D, after removing the mask material 3b, the gate insulating film 14 and the gate electrode 15 are formed on the epitaxial crystal layer 13, and the gate insulating film 24 and the gate electrode 25 are formed on the epitaxial crystal layer 23.

Here, the gate insulating films 14 and 24 and the gate electrodes 15 and 25 are formed by, e.g., the following method. Firstly, a material film of the gate insulating films 14 and 24 such as a $SiO_2$ film, etc., is formed on the whole surface of the semiconductor substrate 1 by a thermal oxidation method and a LPCVD (Low Pressure Chemical Vapor Deposition) method, etc., and a material film of the gate electrodes 15 and 25 such as a polycrystalline Si film, etc., is formed thereon by the LPCVD method. Next, the material film of the gate electrodes 15 and 25 is patterned by an optical lithography method, an X-ray lithography method or an electron beam lithography method, etc., and the material film of the gate insulating films 14 and 24 is further patterned by an RIE (Reactive Ion Etching) method, etc., which results in that the gate insulating films 14 and 24 and the gate electrodes 15 and 25 are obtained.

Figure 4E:
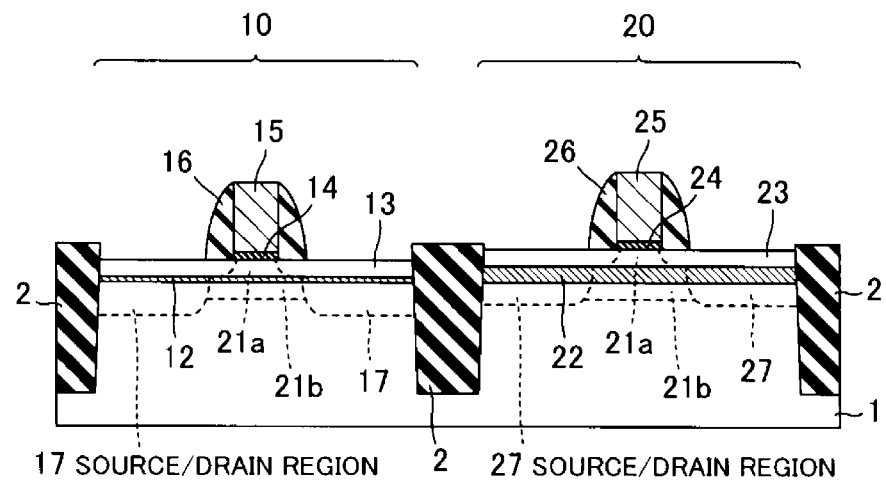

Next, as shown in FIG. 4E, the gate sidewalls 16 and 26 are each formed on side faces of the gate electrodes 15 and 25, the source/drain regions 17 are formed in the semiconductor substrate 1, the impurity diffusion suppression layer 12 and the epitaxial crystal layer 13 in the first transistor region 10, and the source/drain regions 27 are formed in the semiconductor substrate 1, the impurity diffusion suppression layer 22 and the epitaxial crystal layer 23 in the second transistor region 20. Here, regions in the epitaxial crystal layers 13 and 23 sandwiched by the source/drain regions 17 and 27 become the first regions 11a and 21a of the channel regions 11 and 21. The semiconductor device shown in FIG. 1 is obtained by carrying out the above process.

Here, the gate sidewalls 16 and 26 and the source/drain regions 17 and 27 are formed by, e.g., the following method. Firstly, after forming a 1-2 nm-thick $SiO_2$ film (not shown) by the thermal oxidation method, etc., a material film of an offset spacer (not shown) such as a $SiO_2$ film, etc., is formed thereon in a thickness of 3-12 nm by the LPCVD method, etc. Next, the material film of the offset spacer and the $SiO_2$ film thus formed are shaped into an offset spacer (not shown) by the RIE method, etc.

Next, an n-type impurity is implanted into the whole surface of the semiconductor substrate 1 by the ion implantation procedure, etc., using the offset spacer and the gate electrodes 15 and 25 as a mask, which results in that shallow regions (extension regions) of the source/drain regions 17 and 27 are formed. In detail, for example, a halo region is formed by implanting $BF_2$ under conditions of an implantation energy of 20 keV, a dosage of $3.0 \times 10^{13}$ $cm^{-2}$ and an implantation angle of 30-60° (an angle relative to a direction vertical to the surface of the semiconductor substrate 1), and sequentially, the shallow regions of the source/drain regions 17 and 27 are formed by implanting As under conditions of an implantation energy of 1-1.5 keV and a dosage of $5.0 \times 10^{14}$-$1.5 \times 10^{15}$ $cm^{-2}$, and then, heat treatment such as RTA (Rapid Thermal Annealing), etc., is carried out for activation.

Next, a material film of the gate sidewalls 16 and 26 such as $SiO_2$, etc., is formed by the LPCVD method, etc., and is shaped into the gate sidewalls 16 and 26 by the RIE method, etc.

Next, an n-type impurity is implanted into the whole surface of the semiconductor substrate 1 by the ion implantation procedure, etc., using the gate sidewalls 16 and 26 and the gate electrodes 15 and 25 as a mask, which results in that deep high concentration regions of the source/drain regions 17 and 27 are formed. In detail, for example, the deep high concentration regions of the source/drain regions 17 and 27 are formed by implanting As under conditions of an implantation energy of 5-25 keV and a dosage of $1.0 \times 10^{15}$-$5.0 \times 10^{15}$ $cm^{-2}$, and then, heat treatment such as the RTA, etc., is carried out for activation. The p-type impurities in the second regions 11b and 21b are diffused in a heat treatment process such as a process of activating the n-type impurities in the source/drain regions 17 and 27. At this time, since the impurity diffusion suppression layer 22 is thicker than the impurity diffusion suppression layer 12, the concentration of the p-type impurity diffused from the second region 21b into the epitaxial crystal layer 23 is lower than that of the p-type impurity diffused from the second region 11b into the epitaxial crystal layer 13. As a result, the concentration of the p-type impurity contained in the first region 21a of the channel region 21 is lower than that in the first region 11a of the channel region 11. Note that, the diffusion of the p-type impurity in the second regions 11b and 21b may occur in another heat treatment process.

Alternatively, a process for epitaxially growing a Si crystal or a SiGe crystal, etc., on the epitaxial crystal layers 13 and 23 may be carried out before and after forming the deep high concentration regions of the source/drain regions 17 and 27.

Note that, after this, silicided layers may be formed on exposed portions of upper surfaces of the gate electrodes 15 and 25 and the epitaxial crystal layers 13 and 23. In detail, for example, when a Ni silicide layer is formed as a silicide layer, the Ni silicide layer is formed by, e.g., the following method. Firstly, after forming a Ni film on the whole surface of the semiconductor substrate 1 by a sputtering method, etc., a silicide layer is formed by a silicidation reaction between the Ni film and the gate electrodes 15 and 25 and between the Ni film and the epitaxial crystal layers 13 and 23 by heat treatment such as the RTA, etc., under temperature conditions of 400-500° C. Next, unreacted Ni is removed by using a mixed solution of sulfuric acid and hydrogen peroxide solution.

Note that, when the Ni silicide layer is formed, a process of forming a Ni film and subsequently forming a TiN film thereon, or, a process of forming a Ni film and subsequently carrying out the RTA once under a low temperature of 250-400° C., then, etching the Ni film using a mixed solution of sulfuric acid and hydrogen peroxide solution and carrying out the RTA again at 400-550° C. for reducing sheet resistance (two-step annealing), may be carried out.

Furthermore, although it is not illustrated, after obtaining the semiconductor device shown in FIG. 1, an insulating film made of TEOS (Tetraethoxysilane), BPSG (B- and P-doped $SiO_2$) or SiN, etc., is deposited on the whole surface of the semiconductor substrate 1 and is planarized by a CMP (Chemical Mechanical Polishing) method, etc., thereby forming an interlayer insulating film. Following this, a contact hole is formed by, e.g., a photolithography method and the RIE method, a material film of barrier metal such as Ti or TiN, etc., and a material film of contact plug such as W, etc., are formed so as to fill the contact hole and are shaped into a contact plug by applying the CMP, etc. Following this, a metal film is formed on the interlayer insulating film and the contact plug, and the metal film is shaped into a wiring by, e.g., the photolithography method and the RIE method.

(Effect of the First Embodiment)

According to the first embodiment, by forming the impurity diffusion suppression layers 12 and 23 in different thicknesses, it is possible to set threshold voltage of respective transistors in the first transistor region 10 and the second transistor region 20 to be respective appropriate values.

Second Embodiment

The second embodiment is partially different from the first embodiment in the fabrication process of the semiconductor device. The explanation will be omitted or simplified for the points same as the first embodiment.

Although an example of a method of fabricating a semiconductor device according to the present embodiment will be described hereinafter, the method is not limited thereto, practically.

Figure 5A:
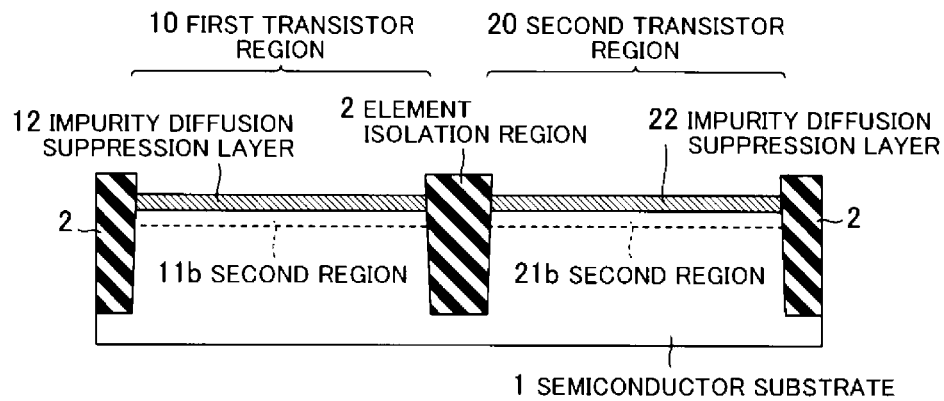
FIGS. 5A to 5C are cross sectional views showing processes for fabricating a semiconductor device according to a second embodiment.
Figure 5B:
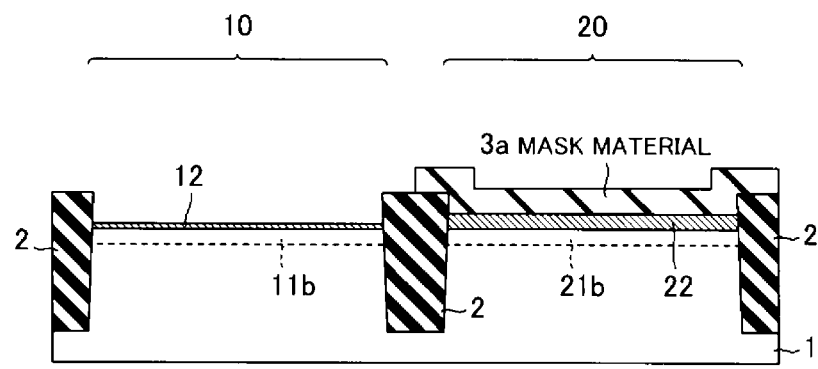
Figure 5C:
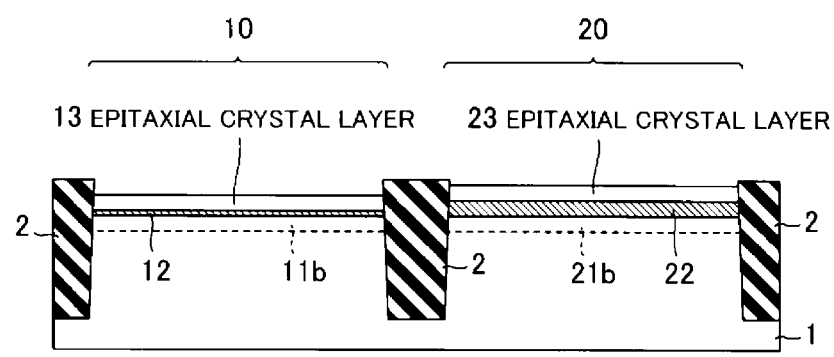

FIGS. 5A to 5C are cross sectional views showing processes for fabricating a semiconductor device according to a second embodiment.

Firstly, the processes until the process, shown in FIG. 4A, for forming and activating wells (not shown) and the second regions 11b and 21b are carried out in the same way as the first embodiment.

Next, as shown in FIG. 5A, the impurity diffusion suppression layers 12 and 22 are each formed on the second regions 11b and 21b in the first transistor region 10 and the second transistor region 20. Here, since the impurity diffusion suppression layers 12 and 22 are simultaneously formed in the same process, the impurity diffusion suppression layers 12 and 22 have the substantially same thickness at this stage. Note that, before forming the impurity diffusion suppression layers 12 and 22, the natural oxide film (not shown) on the region of the semiconductor substrate 1 having the second regions 11b and 21b formed therein is removed using dilute hydrofluoric acid, etc.

Next, as shown in FIG. 5B, the mask material 3a is formed on the impurity diffusion suppression layer 22 in the second transistor region 20, and the impurity diffusion suppression layer 12 in the first transistor region 10 in which the mask material 3a is not formed is etched back by the RIE method, etc. As a result, the thickness of the impurity diffusion suppression layer 12 becomes thinner than that of the impurity diffusion suppression layer 22. Note that, a process of forming an oxide film by oxidizing the surface of the impurity diffusion suppression layer 12 by $O_2$RIE and of removing the oxide film using dilute hydrofluoric acid, etc., is carried out in order to remove a damaged layer generated on the surface of the impurity diffusion suppression layer 12 by etching back.

Next, as shown in FIG. 5C, after removing the mask material 3a, the epitaxial crystal layers 13 and 23 are each formed on the impurity diffusion suppression layers 12 and 22.

After that, the processes after the process, shown in FIG. 4D, for forming the gate insulating films 14 and 24 and gate electrodes 15 and 25 are carried out in the same way as the first embodiment.

(Effect of the Second Embodiment)

According to the second embodiment, it is possible to form the impurity diffusion suppression layers 12 and 22 in different thicknesses by a method different from the first embodiment.

Third Embodiment

The third embodiment is different from the first embodiment in that the impurity diffusion suppression layer is formed only in one transistor region. The explanation will be omitted or simplified for the points same as the first embodiment.

Figure 6:
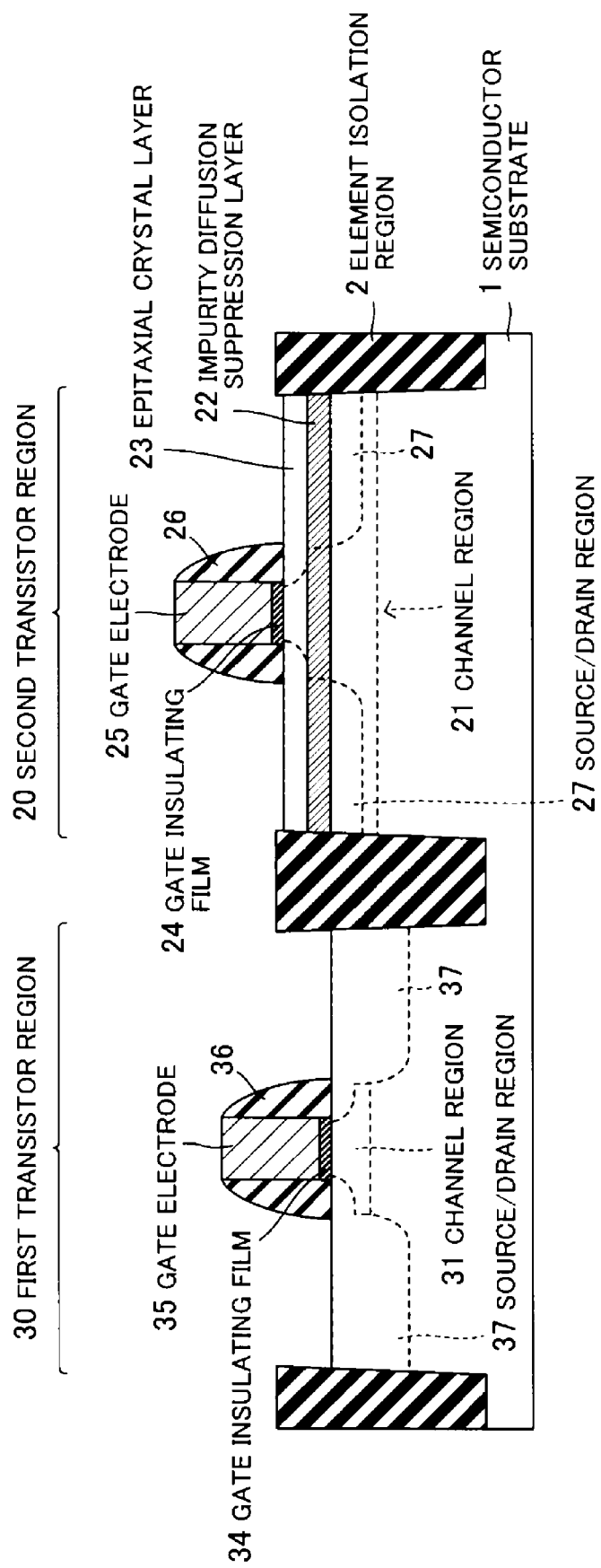
FIG. 6 is a cross sectional view showing a semiconductor device according to a third embodiment.
Figure 7A:
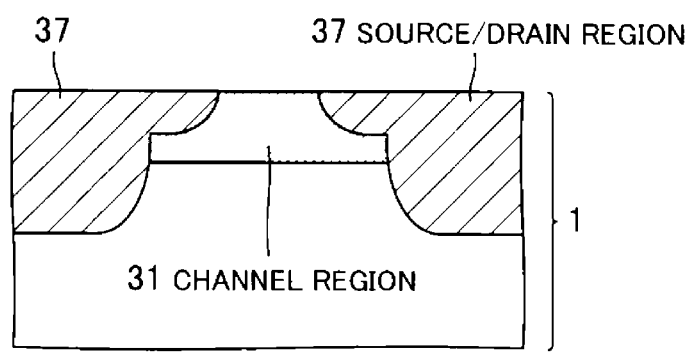
FIGS. 7A and 7B are partial cross sectional views showing a periphery of a channel region in each of first and second transistor regions.
Figure 7B:
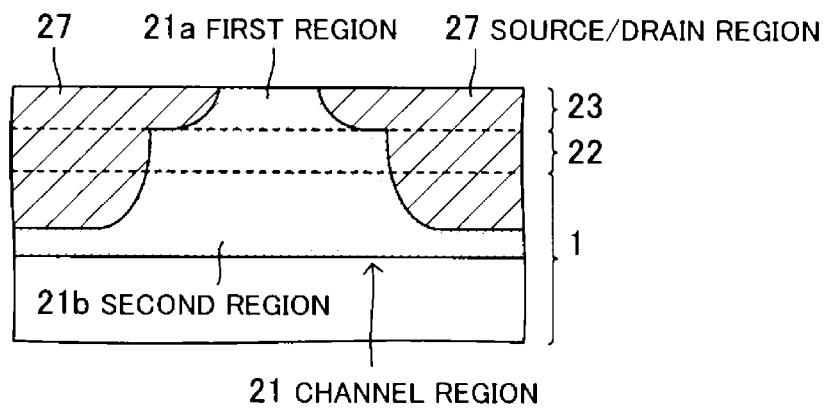

FIG. 6 is a cross sectional view showing a semiconductor device according to a third embodiment. In addition, FIGS. 7A and 7B are partial cross sectional views showing a periphery of a channel region in each of first and second transistor regions. Note that, illustrations of gate insulating films 34 and 24, gate electrodes 35 and 25 and gate sidewalls 36 and 26 are omitted in FIGS. 7A and 7B. The semiconductor device according to the present embodiment has first and second transistor regions 30 and 20 on the semiconductor substrate 1, and the first and second transistor regions 30 and 20 are electrically isolated by the element isolation region 2. Note that, the conductivity type of the first transistor region 30 may be either n-type or p-type.

The first transistor region 30 includes a gate electrode 35 formed on the semiconductor substrate 1 via a gate insulating film 34, gate sidewalls 36 formed on side faces of the gate electrode 35, a channel region 31 formed in a region in the semiconductor substrate 1 below the gate electrode 35, and source/drain regions 37 formed on both sides of the channel region 31.

The second transistor region 20 includes an impurity diffusion suppression layer 22 formed on the semiconductor substrate 1, an epitaxial crystal layer 23 formed on the impurity diffusion suppression layer 22, a gate electrode 25 formed on the epitaxial crystal layer 23 via a gate insulating film 24, gate sidewalls 26 formed on side faces of the gate electrode 25, a channel region 21 formed in a region in the semiconductor substrate 1, the impurity diffusion suppression layer 22 and the epitaxial crystal layer 23 below the gate electrode 25, and source/drain regions 27 formed on both sides of the channel region 21.

In the semiconductor device according to the present embodiment, the impurity diffusion suppression layer is not formed in the first transistor region 30 while the impurity diffusion suppression layer 22 is formed in the second transistor region 20. Therefore, the impurity concentration distribution in the channel region 21 in the second transistor region 20 is steeper than that of the channel region 31 in the first transistor region 30.

Here, it is known that, when a transistor having a channel region with an uniform impurity concentration distribution is compared with a transistor having a channel region with a steep impurity concentration distribution, a thickness of a depletion layer can be reduced in the transistor having a channel region with a steep impurity concentration distribution if the threshold voltages of two transistors are same. It is, for example, described in Ran-Hong Yan et al., "TRANSACTIONS ON DEVICES", vol. 39, no. 7, P. 1704, July 1992, etc.

In addition, it is known that the thinner the thickness of the depletion layer is, the larger the modulation of the threshold voltage with respect to magnitude of bias voltage becomes. It is, for example, described in H. KOURA et al., "Jpn. J. Appl. Phys.", vol. 39, p. 2312, 2000, etc.

Therefore, the modulation of the threshold voltage with respect to the magnitude of bias voltage is larger in a transistor in the second transistor region 20 having the channel region 21 with a steep impurity concentration distribution than in a transistor in the first transistor region 30. Namely, transistors, in one of which the threshold voltage is largely varied and is hardly varied in the other when bias voltage is applied, can be formed in the second transistor region 20 and the first transistor region 30, both of which are on the same substrate.

In addition, an impurity concentration of the channel region 31 in the first transistor region 30 is preferably lower than that of the second region 21b of the channel region 21 in the second transistor region 20. This is because the threshold voltage may increase too much when increasing the impurity concentration of the channel region 31 of which impurity concentration distribution is not steep. On the other hand, in the channel region 21 with a steep impurity concentration distribution, the extension of the depletion layer to the second region 21b can be suppressed by increasing the impurity concentration of the second region 21b. Note that, even if the impurity concentration of the second region 21b is increased, the impurity concentration of the second region 21b can be suppressed to be low by the impurity diffusion suppression layer 22, hence, there is no possibility that the threshold voltage increases too much.

Although an example of a method of fabricating a semiconductor device according to the present embodiment will be described hereinafter, the method is not limited thereto, practically.

Figure 8A:
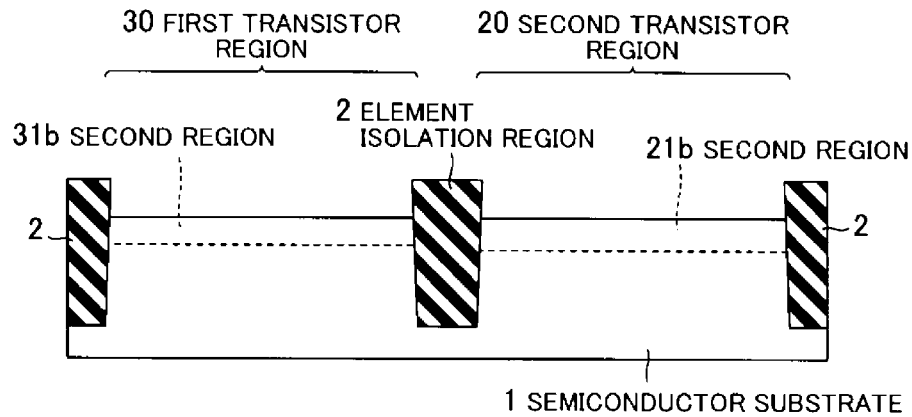
FIGS. 8A to 8C are cross sectional views showing processes for fabricating the semiconductor device according to the third embodiment.
Figure 8B:
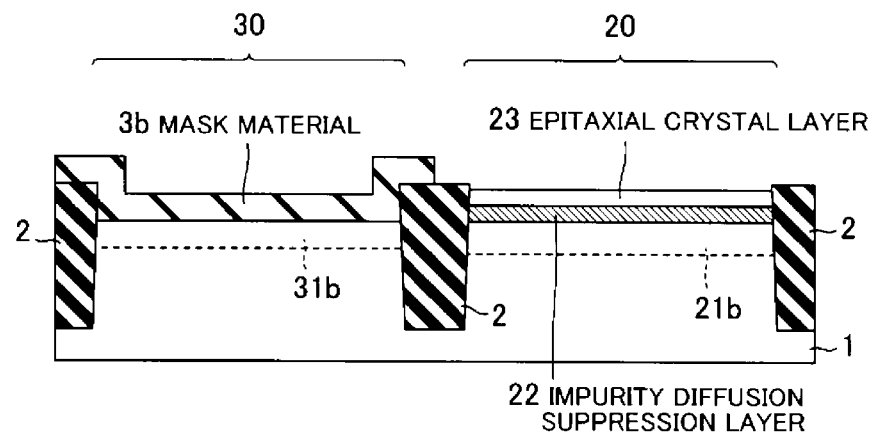
Figure 8C:
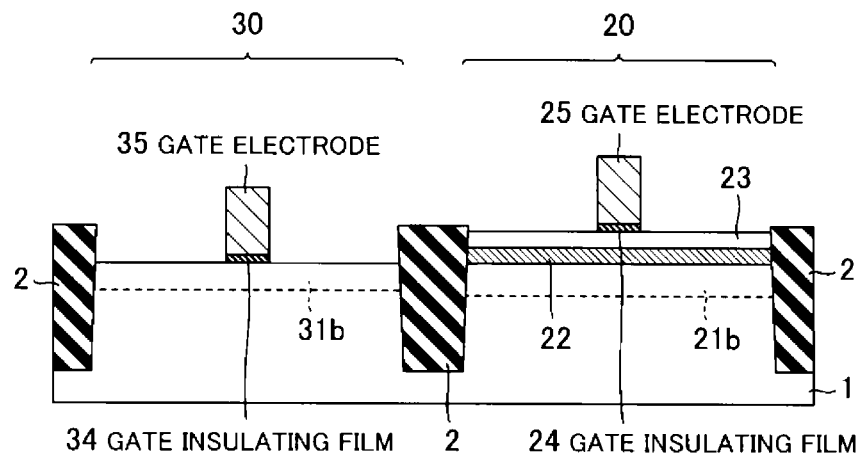

FIGS. 8A to 8C are cross sectional views showing processes for fabricating the semiconductor device according to the third embodiment.

Firstly, the processes until the process, shown in FIG. 4A, for forming and activating wells (not shown) and the second regions 31b and 21b are carried out in the same way as the first embodiment. At this time, a concentration of the p-type impurity in the second region 21b is preferably adjusted to be higher than that of the conductivity type impurity in a second region 31b by using a mask material, etc.

Next, as shown in FIG. 8B, the mask material 3b is formed on the second region 31b in the first transistor region 30, and the impurity diffusion suppression layer 22 and the epitaxial crystal layer 23 are formed on the second region 21b in the second transistor region 20 in which the mask material 3b is not formed. Note that, the natural oxide film (not shown) on a region of the semiconductor substrate 1 having the second region 21b formed therein is removed using dilute hydrofluoric acid, etc., before forming the impurity diffusion suppression layer 22.

Next, as shown in FIG. 8C, after removing the mask material 3b, the gate insulating film 34 and the gate electrode 35 are formed on a region of the semiconductor substrate 1 having the second region 31b therein, and the gate insulating film 24 and the gate electrode 25 are formed on the epitaxial crystal layer 23.

After that, the processes after the process, shown in FIG. 4E, for forming the gate sidewalls 36 and 26 and the source/drain regions 37 and 27 are carried out in the same way as the first embodiment.

(Effect of the Third Embodiment)

According to the third embodiment, by not forming the impurity diffusion suppression layer in the first transistor region 30 while forming the impurity diffusion suppression layer 22 in the second transistor region 20, transistors, in one of which the threshold voltage is largely varied and is hardly varied in the other when bias voltage is applied, can be formed on the same substrate.

Fourth Embodiment

The fourth embodiment is different from the third embodiment in that a gate electrode has a metal film in a transistor in which the impurity diffusion suppression layer is formed. The explanation will be omitted or simplified for the points same as the third embodiment.

Figure 9:
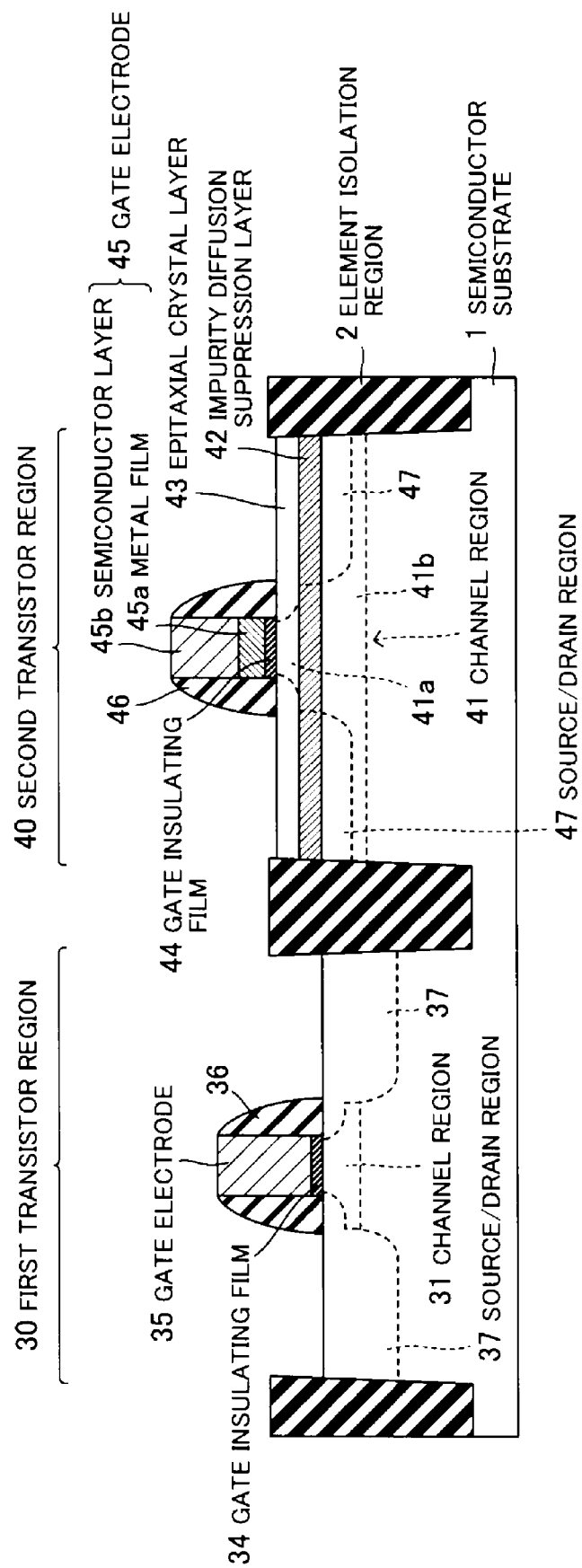
FIG. 9 is a cross sectional view showing a semiconductor device according to a fourth embodiment.

FIG. 9 is a cross sectional view showing a semiconductor device according to a fourth embodiment. The semiconductor device according to the present embodiment has first and second transistor regions 30 and 40 on the semiconductor substrate 1, and the first and second transistor regions 30 and 40 are electrically isolated by the element isolation region 2. The configuration of the second transistor region 40 is same as that of the second transistor region 20 in the third embodiment except a gate insulating film 44 and a gate electrode 45.

In the semiconductor device according to the present embodiment, the impurity diffusion suppression layer is not formed in the first transistor region 30 while an impurity diffusion suppression layer 42 is formed in the second transistor region 40. Therefore, the impurity concentration distribution in a channel region 41 in the second transistor region 40 is steeper than that of the channel region 31 in the first transistor region 30.

In addition, the impurity concentration of the channel region 31 in the first transistor region 30 is preferably lower than that of a second region 41b of the channel region 41 in the second transistor region 40.

The gate electrode 35 in the first transistor region 30 is made of Si-based polycrystalline such as polycrystalline silicon, etc., containing a conductivity type impurity.

The gate insulating film 34 is made of, e.g., an insulating material such as $SiO_2$, SiN or SiON, etc.

The gate insulating film 44 is made of a high-dielectric material (e.g., an Hf-based material such as HfSiON, HfSiO or HfO, etc., a Zr-based material such as ZrSiON, ZrSiO or ZrO, etc., and a Y-based material such as $Y_2O_3$, etc.).

The gate electrode 45 in the second transistor region 40 has a metal film 45a formed on the gate insulating film 44 and a semiconductor layer 45b formed on the metal film 45a. Here, the metal film 45a is made of W, Ta, Ti, Hf, Zr, Ru, Pt, Ir, Mo or Al, etc., or a compound thereof, and the semiconductor layer 45b is made of Si-based polycrystalline such as polycrystalline silicon, etc., containing a conductivity type impurity. Alternatively, the gate electrode 45 may be composed of only the metal film 45a, or may be a full silicide gate electrode that is formed by siliciding the whole gate electrode 45.

In general, in a transistor having a gate insulating film made of a high-dielectric material and a metal gate electrode, it is difficult to set the threshold voltage low due to generation of Fermi level pinning, etc. Here, the Fermi level pinning is a phenomenon that Fermi level in the gate electrode is fixed in the vicinity of mid-gap of Si.

In order to solve this problem, a method to decrease the impurity concentration of the channel region is conventionally used, however, there is a problem that it is not possible to sufficiently lower the threshold voltage by this method due to the limitation of decrease amount of the impurity concentration. In addition, although a method in which a film made of a metal such as La, etc., is formed between the gate insulating film made of a high-dielectric material and the metal gate electrode for reducing the Fermi level pinning is known, this method has the disadvantage that carrier mobility is reduced.

On the other hand, in the semiconductor device according to the present embodiment, similarly to the above-mentioned first to third embodiments, it is possible to steepen the impurity concentration distribution in the channel region 41 and to set the threshold voltage of the transistor low by forming the impurity diffusion suppression layer 42 in the second transistor region 40. As a result, the threshold voltage can be set to be a preferable low value without reducing the carrier mobility in the second transistor region 40 in which the gate insulating film 44 made of a high-dielectric material and the gate electrode 45 including the metal film 45a are formed.

(Effect of the Fourth Embodiment)

According to the fourth embodiment, even when the second transistor region 40, in which the gate insulating film 44 made of a high-dielectric material and the gate electrode 45 including the metal film 45a are formed and a phenomenon such as Fermi level pinning, etc., making the threshold voltage difficult to reduce is generated, and the first transistor region 30, in which the adjustment of the threshold voltage is relatively easy, are formed on the same substrate, the threshold voltage of each transistor can be set to be a preferable low value without reducing the carrier mobility by forming the impurity diffusion suppression layer 42 in the second transistor region 40.

Other Embodiments

It should be noted that embodiments are not intended to be limited to the above-mentioned first to fourth embodiments, and the various kinds of changes thereof can be implemented by those skilled in the art without departing from the gist of the invention.

Furthermore, it is possible to arbitrarily combine the configurations of the above-mentioned first to fourth embodiments without departing from the gist of the invention.

What is claimed is:

1. A semiconductor device, comprising:
   a semiconductor substrate comprising first and second transistor regions that are isolated by an element isolation region;
   a first impurity diffusion suppression layer formed on the semiconductor substrate in the first transistor region;
   a second impurity diffusion suppression layer formed on the semiconductor substrate in the second transistor region, and having a thickness larger than that of the first impurity diffusion suppression layer;
   a first crystal layer formed on the first impurity diffusion suppression layer;
   a second crystal layer formed on the second impurity diffusion suppression layer;
   a first gate electrode formed on the first crystal layer via a first gate insulating film;
   a second gate electrode formed on the second crystal layer via a second gate insulating film;
   a first channel region formed in a region in the semiconductor substrate, the first impurity diffusion suppression layer and the first crystal layer below the first gate electrode in the first transistor region, and containing a first p-type impurity;
   a second channel region formed in a region in the semiconductor substrate, the second impurity diffusion suppression layer and the second crystal layer below the second gate electrode in the second transistor region, and containing a second p-type impurity;
   first source/drain regions formed on both sides of the first channel region; and
   second source/drain regions formed on both sides of the second channel region;
   wherein a concentration of the first p-type impurity in a region of the first channel region in the first crystal layer is lower than that in a region of the first channel region in the semiconductor substrate; and
   a concentration of the second p-type impurity in a region of the second channel region in the second crystal layer is lower than that in a region of the second channel region in the semiconductor substrate.

2. The semiconductor device according to claim 1, wherein the first and second p-type impurities contain at least one of B or In; and
   the first and second impurity diffusion suppression layers comprise a Si:C crystal, a SiGe crystal or a SiGe:C crystal.

3. The semiconductor device according to claim 2, wherein the first and second impurity diffusion suppression layers comprise a Si:C crystal, a C concentration in the Si:C crystal being not less than 0.05 At % (atomic percentage) nor more than 3 At %.

4. The semiconductor device according to claim 1, wherein a concentration of the second p-type impurity in a region of the second channel region in the second crystal layer is lower than that in a region of the first channel region in the first crystal layer.

5. The semiconductor device according to claim 4, wherein threshold voltage of a transistor having the second gate electrode, the second source/drain regions and the second channel region in the second transistor region is lower than that of a transistor having the first gate electrode, the first source/drain regions and the first channel region in the first transistor region.

6. A semiconductor device, comprising:
   a semiconductor substrate comprising first and second transistor regions that are isolated by an element isolation region;
   a first gate electrode formed on the semiconductor substrate via a first gate insulating film in the first transistor region;
   an impurity diffusion suppression layer formed on the semiconductor substrate in the second transistor region;
   a crystal layer formed on the impurity diffusion suppression layer;
   a second gate electrode formed on the crystal layer via a second gate insulating film;
   a first channel region formed in a region in the semiconductor substrate below the first gate electrode in the first transistor region, and containing a first p-type impurity;
   a second channel region formed in a region in the semiconductor substrate, the impurity diffusion suppression layer and the crystal layer below the second gate electrode in the second transistor region, and containing a second p-type impurity;
   first source/drain regions formed on both sides of the first channel region; and
   second source/drain regions formed on both sides of the second channel region;
   wherein a concentration of the second p-type impurity in a region of the second channel region in the crystal layer is lower than that in a region of the second channel region in the semiconductor substrate; and
   the concentration of the second p-type impurity in the region of the second channel region in the semiconductor substrate is higher than a concentration of the first p-type impurity in the first channel region.

7. The semiconductor device according to claim 6, wherein the second p-type impurity contains at least one of B or In; and
   the impurity diffusion suppression layer comprises a Si:C crystal, a SiGe crystal or a SiGe:C crystal.

8. The semiconductor device according to claim 7, wherein the impurity diffusion suppression layer comprises a Si:C crystal, a C concentration in the Si:C crystal being not less than 0.05 At % nor more than 3 At %.

9. The semiconductor device according to claim 6, wherein modulation with respect to bias voltage is larger in threshold voltage of a transistor having the second gate electrode, the second source/drain regions and the second channel region in the second transistor region than in threshold voltage of a transistor having the first gate electrode, the first source/drain regions and the first channel region in the first transistor region.

10. The semiconductor device according to claim 6, wherein the second gate insulating film comprises a high dielectric film;
the second gate electrode includes a layer comprising a metal or a metal compound; and
the first gate electrode comprises Si-based polycrystalline.

11. The semiconductor device according to claim 10, wherein the second p-type impurity contains at least one of B or In; and
the impurity diffusion suppression layer comprises a Si:C crystal, a SiGe crystal or a SiGe:C crystal.

12. The semiconductor device according to claim 7, wherein a C concentration in the Si:C crystal is not less than 0.05 At % nor more than 3 At %.

13. The semiconductor device according to claim 10, wherein modulation with respect to bias voltage is larger in threshold voltage of a transistor having the second gate electrode, the second source/drain regions and the second channel region in the second transistor region than in threshold voltage of a transistor having the first gate electrode, the first source/drain regions and the first channel region in the first transistor region.

14. A method of fabricating a semiconductor device, comprising:
forming first and second channel regions by implanting a p-type impurity into the vicinity of a surface of the semiconductor substrate in each of first and second transistor regions;
forming a first impurity diffusion suppression layer on the first channel region and then a first crystal layer on the impurity diffusion suppression layer as well as forming a second impurity diffusion suppression layer on the second channel region and then a second crystal layer on the second impurity diffusion suppression layer, the first and second impurity diffusion suppression layers having a function of suppressing diffusion of the p-type impurity, the second impurity diffusion suppression layer being thicker than the first impurity diffusion suppression layer; and
each forming gate electrodes on the first and second crystal layers via gate insulating films.

15. The method of fabricating a semiconductor device according to claim 14, wherein the first impurity diffusion suppression layer and the first crystal layer are selectively formed in a state that the second transistor region is masked; and
the second impurity diffusion suppression layer and the second crystal layer are selectively formed in a state that the first transistor region is masked.

16. The method of fabricating a semiconductor device according to claim 14, wherein, after simultaneously forming the first and second impurity diffusion suppression layers to the same thickness, the first impurity diffusion suppression layer is selectively thinned.

17. The method of fabricating a semiconductor device according to claim 14, wherein the p-type impurities contain at least one of B or In; and
the first and second impurity diffusion suppression layers comprise a Si:C crystal, a SiGe crystal or a SiGe:C crystal.

18. The method of fabricating a semiconductor device according to claim 17, wherein the first and second impurity diffusion suppression layers comprise a Si:C crystal, a C concentration in the Si:C crystal being not less than 0.05 At % nor more than 3 At %.

19. The method of fabricating a semiconductor device according to claim 17, wherein the p-type impurity is implanted into the vicinity of the surface of the semiconductor substrate in the first and second transistor regions at a substantially same concentration.

20. The method of fabricating a semiconductor device according to claim 19, wherein a concentration of the p-type impurity diffused from the second channel region into the second crystal layer is lower than that of the p-type impurity diffused from the first channel region into the first crystal layer, at the time of applying heat treatment.

* * * * *